United States Patent
Seow et al.

(10) Patent No.: US 12,224,765 B1
(45) Date of Patent: Feb. 11, 2025

(54) SAR ADC CAPABLE OF FULL-SCALE VOLTAGE AUTO-TUNING AND METHOD FOR THE SAME

(71) Applicant: PixArt Imaging Incorporation, Hsinchu (TW)

(72) Inventors: Boon-Eu Seow, Penang (MY); Kei-Tee Tiew, Penang (MY)

(73) Assignee: PIXART IMAGING INCORPORATION, Hsinchu (TW)

( * ) Notice: Subject to any disclaimer, the term of this patent is extended or adjusted under 35 U.S.C. 154(b) by 151 days.

(21) Appl. No.: 18/194,172

(22) Filed: Mar. 31, 2023

(51) Int. Cl.
*H03M 1/18* (2006.01)
*H03M 1/38* (2006.01)
*H03M 1/00* (2006.01)
*H03M 1/12* (2006.01)

(52) U.S. Cl.
CPC .............. *H03M 1/18* (2013.01); *H03M 1/38* (2013.01); *H03M 1/00* (2013.01); *H03M 1/12* (2013.01); *H03M 1/124* (2013.01)

(58) Field of Classification Search
CPC ............ H03M 1/18; H03M 1/38; H03M 1/00; H03M 1/12; H03M 1/124
See application file for complete search history.

(56) References Cited

U.S. PATENT DOCUMENTS

2012/0112938 A1* 5/2012 Haneda ............... H03M 1/1019
341/110

* cited by examiner

*Primary Examiner* — Joseph J Lauture
(74) *Attorney, Agent, or Firm* — Tung & Associates

(57) ABSTRACT

An SAR ADC includes: at least one sub-ADC, configured to convert a corresponding input signal to a corresponding SAR code; and a tuning control unit, configured to adjust a full-scale voltage (VFS) of each of the sub-ADC to a corresponding predetermined target level in a VFS tuning mode. The tuning control unit generates a tuning code to control an adjusting capacitor array coupled to the sub-ADC for tuning the VFS. The tuning control unit controls the sub-ADC to convert plural reference voltages in the VFS tuning mode and extrapolating the conversion result to determine a corresponding calibrating VFS. The tuning control unit determines whether the calibrating VFS meeting the target VFS and loops the adjusting process in a linear search method or in a SAR method.

20 Claims, 10 Drawing Sheets

| Parameters | VFS Code (C-Code) | Capacitance fF) | 25C/TT | -40C/SS | 125C/FF |
|---|---|---|---|---|---|
| Full Scale Voltage (VFS) | 0000 (VFS$_{max}$) | 0 | 0.706 | 0.702 | 0.698 |
| | 0111 | 8 | 0.656 | 0.658 | 0.654 |
| | 1111(VFS$_{min}$) | 15 | 0.636 | 0.632 | 0.628 |
| Supply Voltage (V) | | | 1.252 | 1.248 | 1.257 |
| VBG (Bandgap Voltage)(V) | | | 1.129 | 1.116 | 1.152 |
| VFSmax-VFSmin (Tuning Range) | | | 0.070 | 0.070 | 0.070 |
| (VFSmax-VFSmin)/VBG (%) | | | 6.20% | 6.27% | 6.08% |

SAR ADC CAPABLE OF FULL-SCALE VOLTAGE AUTO-TUNING AND METHOD FOR THE SAME

BACKGROUND OF THE INVENTION

Field of Invention

The present invention relates to a successive approximation register analog-to-digital converter (SAR ADC). Particularly it relates to a SAR ADC capable of automatically tuning the full-scale voltage. The present invention relates to a method for controlling a SAR ADC for automatically tuning the full-scale voltage.

Description of Related Art

FIG. 1 shows a prior art successive approximation register (SAR) analog-to-digital converter (ADC) 1001 which includes a sample-and-hold (S/H) circuit 110, a capacitive digital-to-analog converter (CDAC) 120, a comparator 130 and a SAR logic circuit 140, and is configured to convert an input signal Vin to an output code Dout by the successively controlling the SAR code S_code. The SAR ADC's maximum allowable input range of the input signal Vin with the purpose of not to saturate the SAR ADC digital output code, is known as the SAR ADC full-scale voltage (VFS). The VFS of the prior art SAR ADC 1001 is determined by the front-end circuit blocks such as the S/H circuit 110, the CDAC 120 and the comparator 130 as well as the reference voltages (not shown in FIG. 1) and is sensitive to the components and the reference voltage variations. For applications that require accurate VFS such as the temperature sensors and applications employing multi-channel ADCs requiring good matching of VFS among the SAR ADCs, the VFS has to be manually tuned.

A drawback of the prior art SAR ADC 1001 is that the VFS has to be manually tuned by usually adjusting the reference voltages.

FIG. 2A shows a prior art CDAC of the 9-bit differential SAR ADC 1002 using monotonic or switch-back switching method. FIG. 2B and FIG. 2C show prior arts switching procedure of monotonic switching method and of switch-back switching method respectively. The prior art SAR ADC 1002 includes sample and hold circuit 111, a CDAC 121 a comparator 130 and the SAR logic circuit 140, and is configured to convert a differential input signal (Vinp-Vinn) to an output code Dout. The switching methods of the SAR ADC 1002 can be either monotonic or switch-back switching method, as shown in FIG. 2A. When the CDAC 121 is configured in the monotonic switching method, a capacitor C1 and a capacitor C2 (both are 8th bit) are connected to the CDAC reference voltage Vr respectively. When the CDAC 121 is configured in the switch-back switching method, the capacitor C1 and the capacitor C2 are then switched to the ground (Gnd) respectively.

In FIG. 2B, the common-mode voltage Vcm of the comparator input varies from Vcm to Vr in the monotonic switching method. The variation of Vcm induces dynamic offset and the parasitic capacitance variation of the comparator that affect the SAR ADC linearity. The switch-back switching method is then introduced to reduce the Vcm variation, which then reduces the dynamic offset and parasitic capacitance variation of the comparator 130.

The VFS in both CDAC configurations as mentioned above is dependent on the CDAC reference voltage Vr, which is normally derived from a bandgap reference voltage VBG. The VFS is also dependent on the component matching and part-to-part variation of capacitor array in CDAC 121.

Therefore, whenever there are changes in system requirement which then affects the VFS requirement, the capacitance of CDAC 121 and the comparator 130 have to be re-optimized to meet the new system requirement. In both CDAC switching configurations, VFS is usually tuned by manually optimizing the CDAC and the capacitance at the comparator input or tuning the CDAC reference voltage Vr, which are not easy to re-adjust.

Compare to the prior art SAR ADCs above, the present invention proposes a novel circuit system which is capable of making the VFS more flexible and can be digitally tuned. According to the present invention, the VFS is automatically tuned by adjusting the input capacitance of the SAR ADC through controlling an adjusting capacitor array. The main purpose of the present invention is to provide a simple and programmable VFS tuning scheme to replace the tedious manual VFS tuning. The proposed VFS tuning scheme also has the added advantage of insensitivity to temperature and can achieve finer tuning step size.

SUMMARY OF THE INVENTION

From one perspective, the present invention provides a successive approximation register analog-to-digital converter (SAR ADC), comprising: at least one sub-ADC, wherein each of the at least one sub-ADC is configured to convert a corresponding input signal to a corresponding SAR code; and a tuning control unit, configured to adjust a full-scale voltage of each of the sub-ADC to a corresponding predetermined target level in a VFS tuning mode; wherein each of the at least one sub-ADC includes: a sample-and-hold circuit, configured to operably generate a sample-and-hold signal by sample-and-holding the input signal; a capacitive digital-to-analog converter (CDAC), configured to operably generate a DAC output signal according to the SAR code; a comparator, configured to operably compare the sample-and-hold signal and the DAC output signal to generate a comparison signal; a SAR logic circuit, configured to operably generate the SAR code according to the comparison signal using a binary successive approximation register conversion method; and an adjusting capacitor array, coupled to an output terminal of the CDAC and configured to operably adjust an equivalent capacitance on the output terminal of the CDAC; wherein in the VFS tuning mode, the tuning control unit is configured to operably generate a capacitor tuning code to adjust the equivalent capacitance on the output terminal of the CDAC, so as to adjust a full-scale voltage of each of the at least one sub-ADC to the predetermined target level according to the following steps: S100: setting the capacitor tuning code to an initial code; S201: adjusting the input signal to plural reference voltages; S202: controlling the sub-ADC to convert the plural reference voltages to corresponding plural digital reference codes; S203: extrapolating plural pairs of the plural reference voltages versus the plural digital reference codes to obtain a calibrating full-scale voltage corresponding to the capacitor tuning code; S300: determining whether a difference between the calibrating full-scale voltage and the predetermined full-scale voltage level is meeting a target, wherein if the difference is meeting the target, entering a step S800, else entering a step S400; S400: updating the capacitor tuning code according to the difference and return to the step S201; and S800: memorizing the capacitor tuning code for the sub-ADC to operate with the full-scale voltage having the predetermined target level in a normal operation mode.

In one embodiment, the step of updating the capacitor tuning code is achieved by a linear search method or by a binary successive approximation method.

In one embodiment, a count of the plural reference voltages is equal to or higher than 3.

In one embodiment, the step S203 further includes: extrapolating the plural pairs of the plural reference voltages versus the plural digital reference codes to obtain an offset of the SAR DAC corresponding to the capacitor tuning code; wherein the calibrating full-scale voltage is obtained by extrapolation after compensating the offset.

In one embodiment, the adjusting capacitor array includes binary-weighted capacitors which are controlled by the capacitor tuning code.

In one embodiment, the calibrating full-scale voltage decreases in response to the increasing of the equivalent capacitance on the output terminal of the CDAC.

In one embodiment, the plural reference voltages are arranged in an arithmetic series.

In one embodiment, one of the plural reference voltages is 0V.

In one embodiment, all the plural reference voltages are smaller than the predetermined full-scale voltage level.

In one embodiment, each of the sub-ADC is configured to operate in a monotonic switching method or in a switch-back switching method.

From another perspective, the present invention provides a method for automatically tuning a full-scale voltage of a successive approximation register analog-to-digital converter (SAR ADC), wherein the SAR ADC includes a sample-and-hold circuit for generating a sample-and-hold signal by sample-and-holding the input signal; a capacitive digital-to-analog converter (CDAC) for generating a DAC output signal according to the SAR code; a comparator for comparing the sample-and-hold signal and the DAC output signal to generate a comparison signal; and a SAR logic circuit for generating the SAR code according to the comparison signal using a binary successive approximation register conversion method; wherein the method comprises: providing a VFS adjusting means which is controlled by a tuning code for adjusting the full-scale voltage of the SAR ADC; and generating the tuning code to control the VFS adjusting means, so as to tune the full-scale voltage of the SAR ADC to a predetermined target level in a VFS tuning mode according to the following steps: S100: setting the tuning code to an initial code; S201: adjusting the input signal to plural reference voltages; S202: controlling the sub-ADC to convert the plural reference voltages to plural digital reference codes; S203: extrapolating plural pairs of the plural reference voltages versus the plural digital reference codes to obtain a calibrating full-scale voltage corresponding to the tuning code; S300: determining whether a difference between the calibrating full-scale voltage and the predetermined full-scale voltage level is meeting a target, wherein if the difference is meeting the target, entering a step S800, else entering a step S400; S400: updating the tuning code according to the difference and return to the step S201; and S800: memorizing the tuning code for the sub-ADC to operate with the full-scale voltage having the predetermined target level in a normal operation mode.

In one embodiment, the step S203 further includes: extrapolating the plural pairs of the plural reference voltages versus the plural digital reference codes to obtain an offset of the SAR DAC corresponding to the tuning code; wherein the calibrating full-scale voltage is obtained by extrapolation after compensating the offset.

In one embodiment, the VFS adjusting means includes binary-weighted capacitors which are controlled by the tuning code.

In one embodiment, SAR ADC is configured to operably operate in a monotonic switching method or in a switch-back switching method.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the circuits and the signal waveforms, but not drawn according to actual scale.

Figure 3:
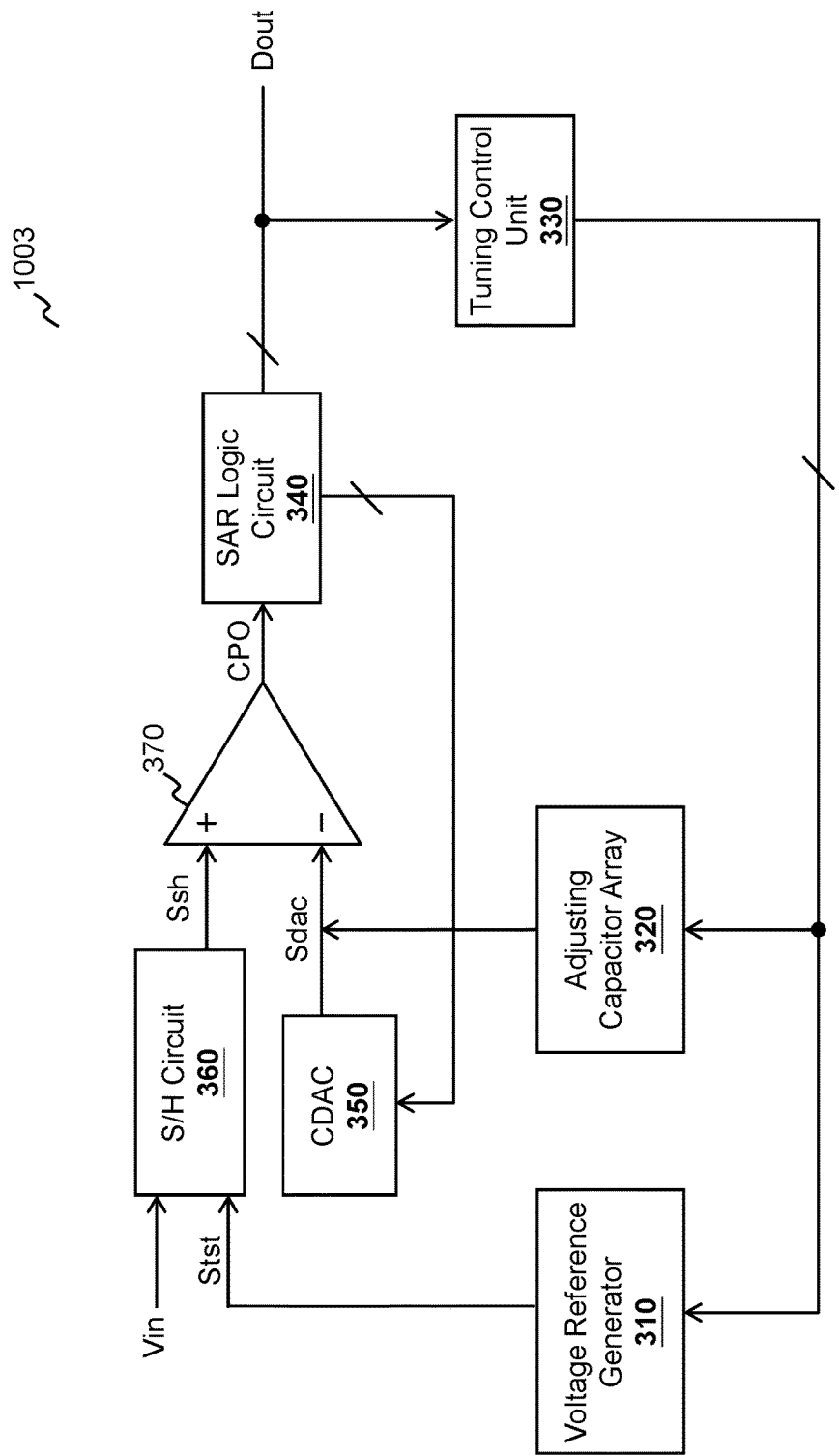
FIG. 3 shows a block diagram of an embodiment of the SAR ADC with VFS auto-tuning scheme according to the present invention.

FIG. 3 shows a block diagram of an embodiment of the SAR ADC with VFS auto-tuning scheme according to the present invention. In one embodiment, as shown in FIG. 3, the SAR ADC 1003 with VFS auto-tuning scheme comprises a voltage reference generator 310, an adjusting capacitor array 320, a tuning control unit 330, a SAR logic circuit 340, a capacitive digital-to-analog converter CDAC 350, a sample-and-hold circuit (S/H circuit) 360 and a comparator 370.

The S/H circuit 360 is configured to operably generate a sample-and-hold signal Ssh by sample-and-holding the input signal Vin. The capacitive digital-to-analog converter 350 is configured to operably generate a DAC output signal Sdac according to a SAR code S_code generated by SAR logic circuit 340. The comparator 370 is configured to operably compare the sample-and-hold signal Ssh and the DAC output signal Sdac to generate a comparison signal CPO. The SAR logic circuit 340 is configured to operably generate the SAR code S-code according to the comparison signal COP using a binary successive approximation register conversion method. The adjusting capacitor array 320 is coupled to an output terminal of the CDAC and configured to operably adjust an equivalent capacitance on the output terminal of the CDAC 350. In a VFS tuning mode, the tuning control unit is configured to operably generate a capacitor tuning code C_Code to control the adjusting capacitor array 320, so as to adjust the equivalent capacitance on the output terminal of the CDAC, so as to adjust VFS of the SAR ADC to a predetermined target level.

The voltage reference generator 310 is configured to operably generate an input test signal Stst with plural predetermined voltage reference levels, which is used for tuning the VFS in the VFS tuning mode. According to the present invention, the VFS can be tuned by adjusting the equivalent capacitance on the output terminal of the CDAC 350 through adjusting the adjusting capacitor array 320. In one embodiment, the VFS decreases in response to the increasing of the equivalent capacitance on the output terminal of the CDAC.

The voltage reference generator 310 and the adjusting capacitor array 320 are both controlled by the tuning control unit 330 based on a VFS tuning algorithm. The detailed descriptions of the adjusting capacitor array 320, the voltage reference generator 310 and the VFS tuning algorithm of the tuning control unit 330 are explained in the following embodiments.

Figure 4A:
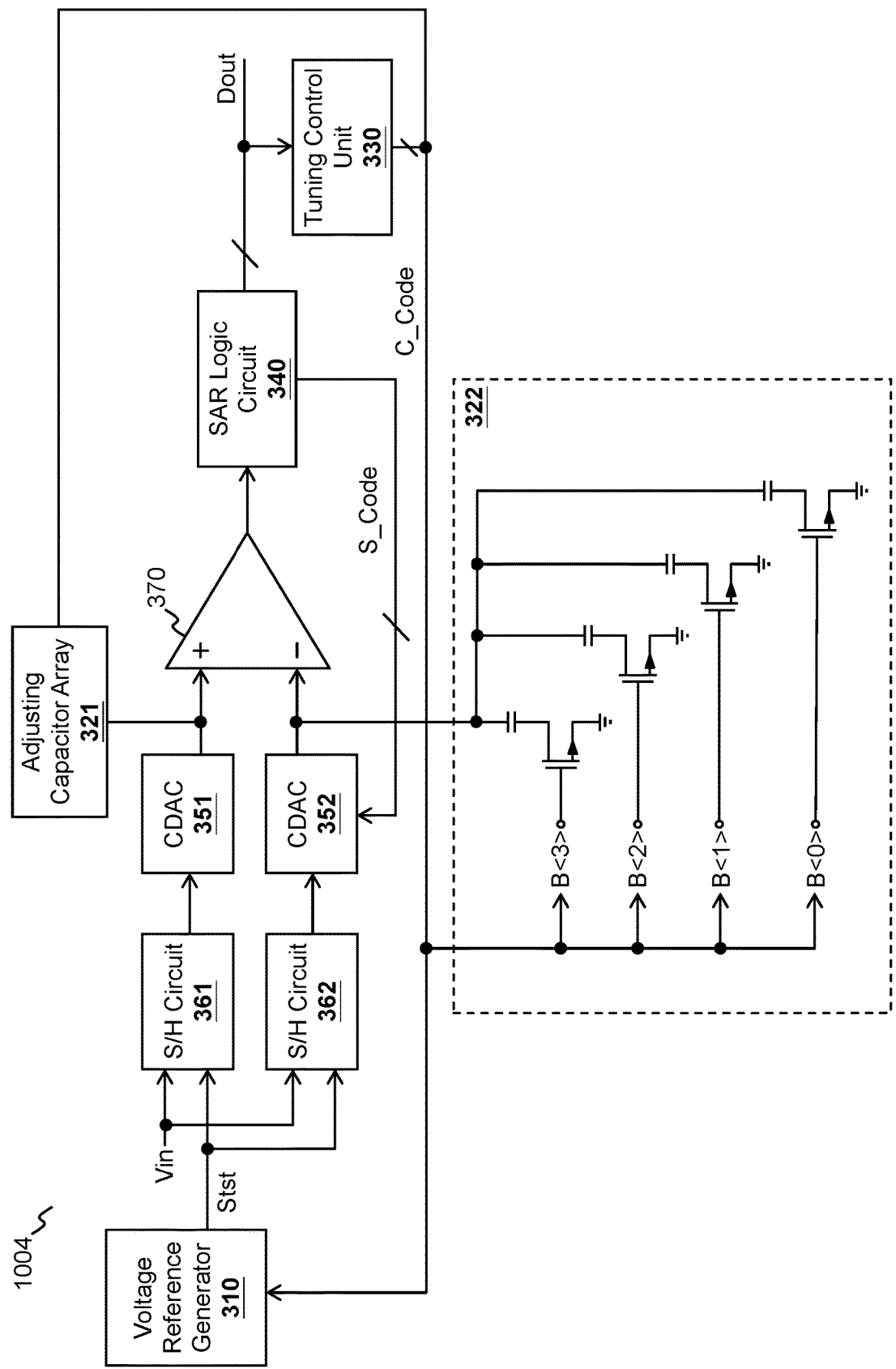
FIG. 4A shows a schematic diagram of a more specific embodiment of the SAR ADC with VFS auto-tuning scheme according to the present invention.

FIG. 4A shows a schematic diagram of a more specific embodiment of the SAR ADC with VFS auto-tuning scheme according to the present invention. In one embodiment, as shown in FIG. 4A, the SAR ADC 1004 with VFS auto-tuning scheme is implemented as a differential SAR ADC. The S/H circuit of SAR ADC 1004 includes an S/H circuit 361 and an S/H circuit 362, and the CDAC of SAR ADC 1004 includes a CDAC 351 and a CDAC 352. In one embodiment, the adjusting capacitor array (321 or 322) includes plural capacitors and plural NMOS switches. In a preferred embodiment, the plural capacitors are binary-weighted capacitors, which can be controlled digitally by for example a 4-bit binary capacitor tuning code C_Code. The capacitor tuning code C_Code controls the plural capacitors to be effectively coupled to the output terminal of the CDAC or not, so as to adjust the capacitance on the output terminal of the CDAC.

Figures 4B, 5:
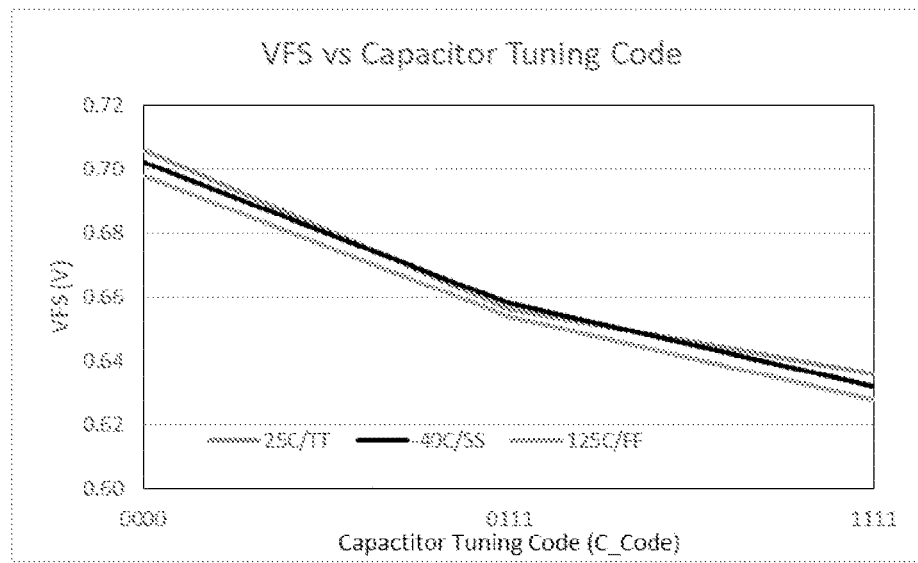
FIG. 4B shows the transfer function curve of the adjusting capacitor array (VFS versus C_Code) for typical process corner and two worst process corners of −40° C./Slow-Slow and 125° C./Fast-Fast.
FIG. 5 shows the simulation results of an embodiment of the SAR ADC with VFS auto-tuning scheme for differential SAR ADC according to the present invention.

FIG. 4B shows the transfer function curve of the adjusting capacitor array (VFS versus C_Code) for typical process corner and two worst process corners of −40° C./Slow-Slow and 125° C./Fast-Fast. In one embodiment, the VFS is monotonic across the C_Code and it has 4-bit 16 levels of capacitor tuning code C_Code. In this embodiment, since the total effective capacitance coupled to the output terminal of the CDAC increases when the capacitor tuning code C_Code is increasing, the VFS is monotonically decreases when the capacitor tuning code C_Code is increasing.

FIG. 5 shows the simulation results of an embodiment of the SAR ADC with VFS auto-tuning scheme for differential SAR ADC according to the present invention. In one embodiment, it can be seen that the VFS tuning range (VFSmax-VFSmin) across these three corners is consistent, i.e. 70 mV. In addition, the ratio of (VFSmax−VFSmin)/VBG is also consistent, i.e. between 6.08% and 6.27%, across the worst process corners. In order to increase the precision of the VFS tuning, more tuning bits can be implemented to have a finer step of tuning.

Figure 6:
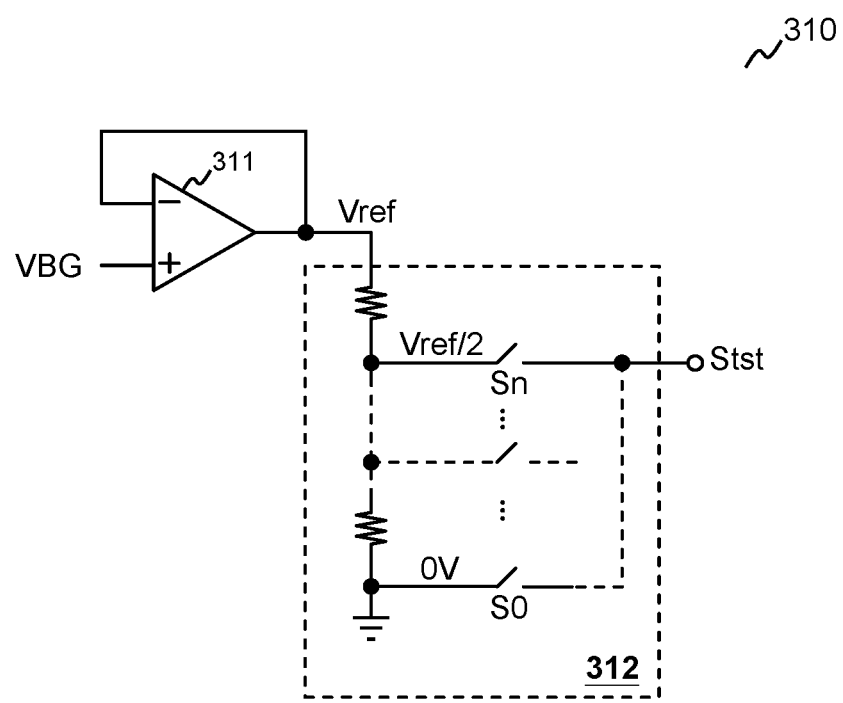
FIG. 6 shows a schematic diagram of an embodiment of the reference voltage generator according to the present invention.

FIG. 6 shows a schematic diagram of an embodiment of the reference voltage generator according to the present invention. In one embodiment, the reference voltage generator 310 includes a voltage buffer 311 and a resistive voltage divider 312. The voltage buffer 311 has an input from for example a bandgap reference voltage VBG. The resistive voltage divider 312 is configured to operably produce plural reference voltages, such as verf*3/4, vref/2, vref/4, 0V, etc. In a preferred embodiment, the plural reference voltages are arranged in an arithmetic series. In one embodiment, all the plural reference voltages are lower than the predetermined full-scale voltage level.

The purpose of the reference voltage generator 310 in FIG. 6 is to produce the input test signal Stst to the input of S/H circuit for the VFS auto-tuning. In a VFS tuning mode, the tuning control unit 330 can program the input test signal Stst to plural values selected from n+1 selectable reference voltages 0V~Vref/2 as shown in FIG. 6 by controlling the switches S0~Sn. The reference voltage points (i.e. plural values of the input test signal) should ideally be at least 3 points having different levels in order to estimate the SAR ADC offset and to extrapolate the VFS value more accurately. The accuracy of the VFS extrapolation can be increased by having more reference voltage points, but this will incur extra tuning time. The tuning control unit 330 turns on the respective reference voltages through switches S0 to Sn during the VFS tuning mode, the final tuned VFS is then determined through the extrapolated ADC transfer function curve based on the VFS tuning algorithm as described in the next embodiment.

Figure 7A:
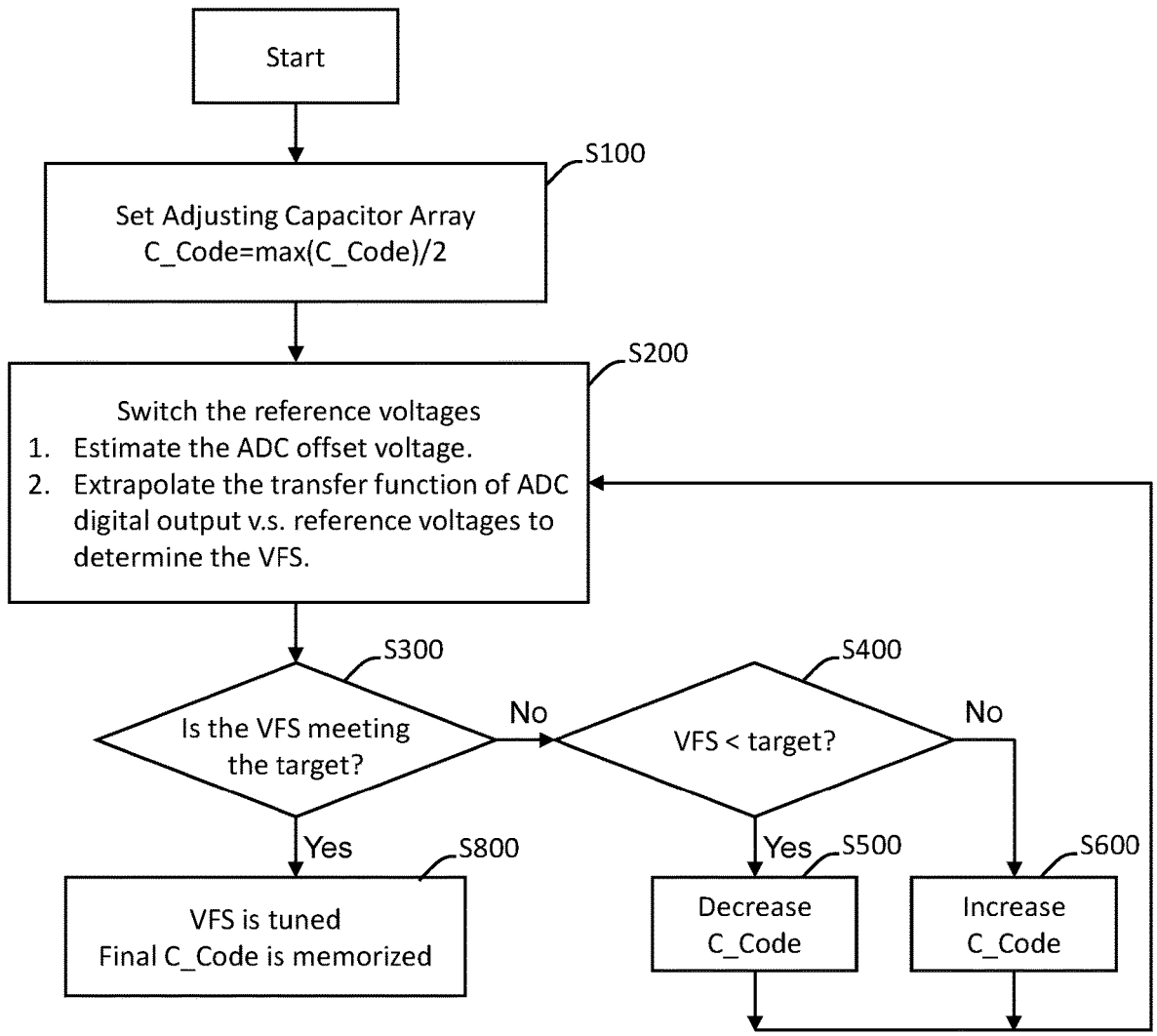
FIG. 7A shows a flowchart of an embodiment of the VFS auto-tuning algorithm according to the present invention.
Figure 7B:
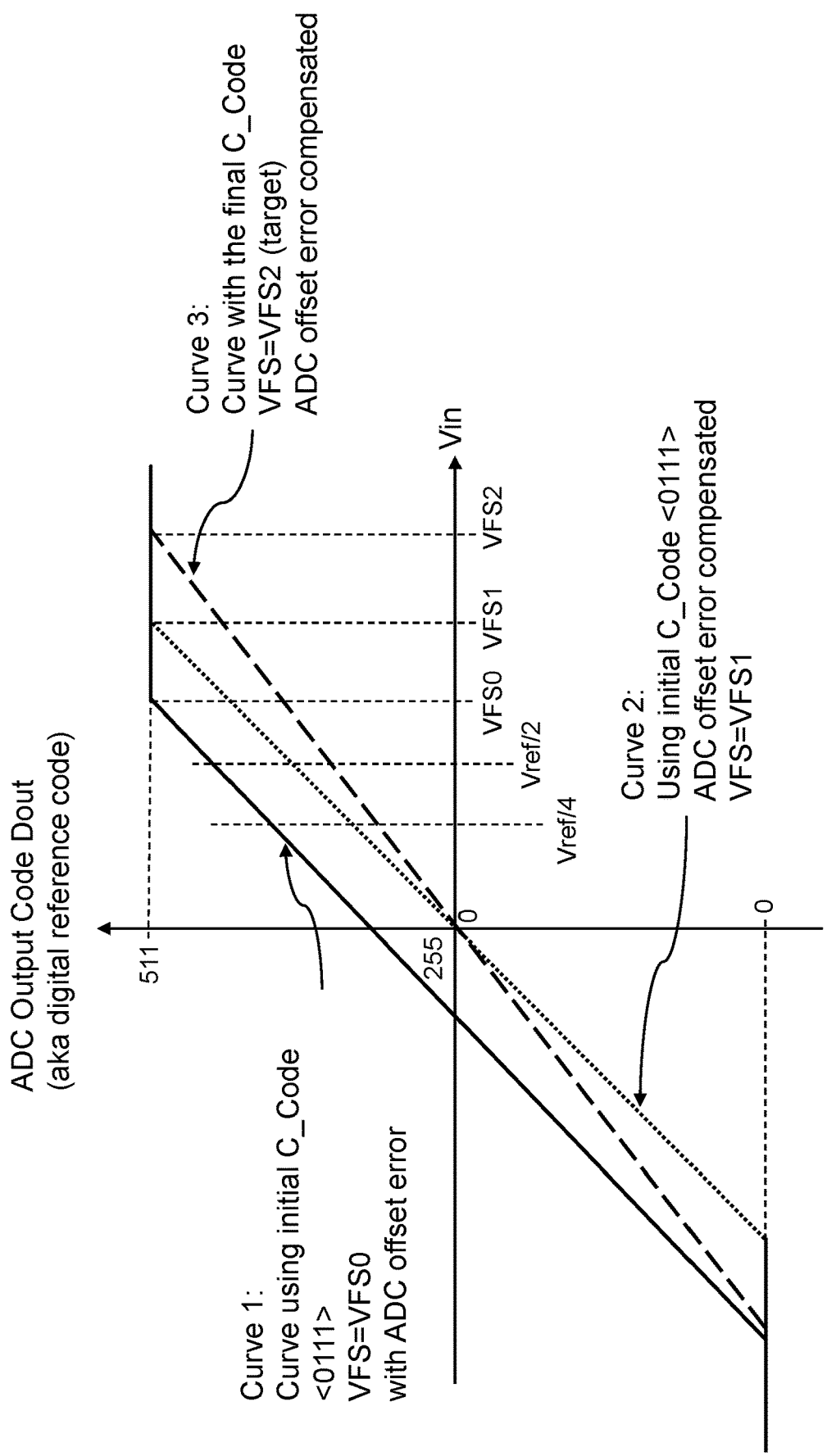
FIG. 7B shows the extrapolated curve of the transfer function of the VFS with C_Code=0111 according to an embodiment of the present invention.

FIG. 7A shows a flowchart of an embodiment of the VFS tuning algorithm according to the present invention. FIG. 7B shows the extrapolated curve of the transfer function of the VFS with C_Code=0111 according to an embodiment of the present invention. In one embodiment, the VFS tuning algorithm starts by setting the adjusting capacitor array (step S100) to an initial code. For example, in step S100 as show in FIG. 7A, the VFS tuning algorithm sets C_Code to the middle code of the 4-bit 16-level binary code, which is "0111" (i.e. seventh bit). Once the C_Code has been set to the initial code, the VFS tuning algorithm begins to switch the input testing signal Stst, with at least three reference voltage points, e.g. 0V, Vref/4, and Vref/2 as shown in FIG. 7B. An initial transfer function curve of the SAR ADC output code Dout versus the reference voltages (Curve 1, the solid line curve) can then be extrapolated and constructed using these three pairs of digital reference codes versus reference voltage points, as illustrated in FIG. 7B. In the VFS tuning, the ADC output code Dout can be referred to as "digital reference code". The VFS corresponding to the C_Code (VFS0) is then estimated and determined by this extrapolated transfer function curve (step S200). The SAR ADC offset error can also be determined and compensated as shown in FIG. 7B (Curve 2, the dotted line curve). The VFS of Curve 2 is VFS1 which is shifted from VFS0 of the Curve 1 due to the SAR ADC offset error being compensated.

In one embodiment, once the VFS is determined from the C_Code, the next decision making of the VFS tuning algorithm is to determine whether or not the targeted VFS has been achieved (step S300). If the condition is not met, the capacitor tuning code C_Code is updated to one code lower or higher from the previous C_Code depending on either VFS is higher or lower than the targeted VFS (step S400, S500 and S600). The VFS tuning algorithm repeats (after step S500 or S600, back to step S200) until the VFS is tuned to the targeted VFS required by the system. The VFS tuning algorithm shows that the target VFS can be determined and tuned accurately based on the extrapolated transfer function curve. When the calibrating VFS in S300 meets the target, the final capacitor tuning code C_Code can be memorized digitally in a memory or a register (step S800). The SAR ADC with the final capacitor tuning code can then perform analog-to-digital conversion according to the input signal Vin (Vinp, Vinn) in a normal operation mode. Curve 3 (dashed line curve) in FIG. 7B shows the curve having the target VFS (i.e. VFS2), higher than VFS1 in this embodiment, which is automatically tuned by looping the searching steps shown in FIG. 7A and obtained by the transfer function with the final capacitor tuning code C_Code.

Note that if the offset of the SAR ADC is compensated by other means before the VFS tuning, the step of estimating and compensating the offset in step S200 can be omitted. It is also noteworthy that the flowchart shown in FIG. 7A corresponds to an embodiment of binary successive approximation method for tuning the VFS. However, it can alternatively be achieved by other searching methods, such as linear search method.

Figure 8:
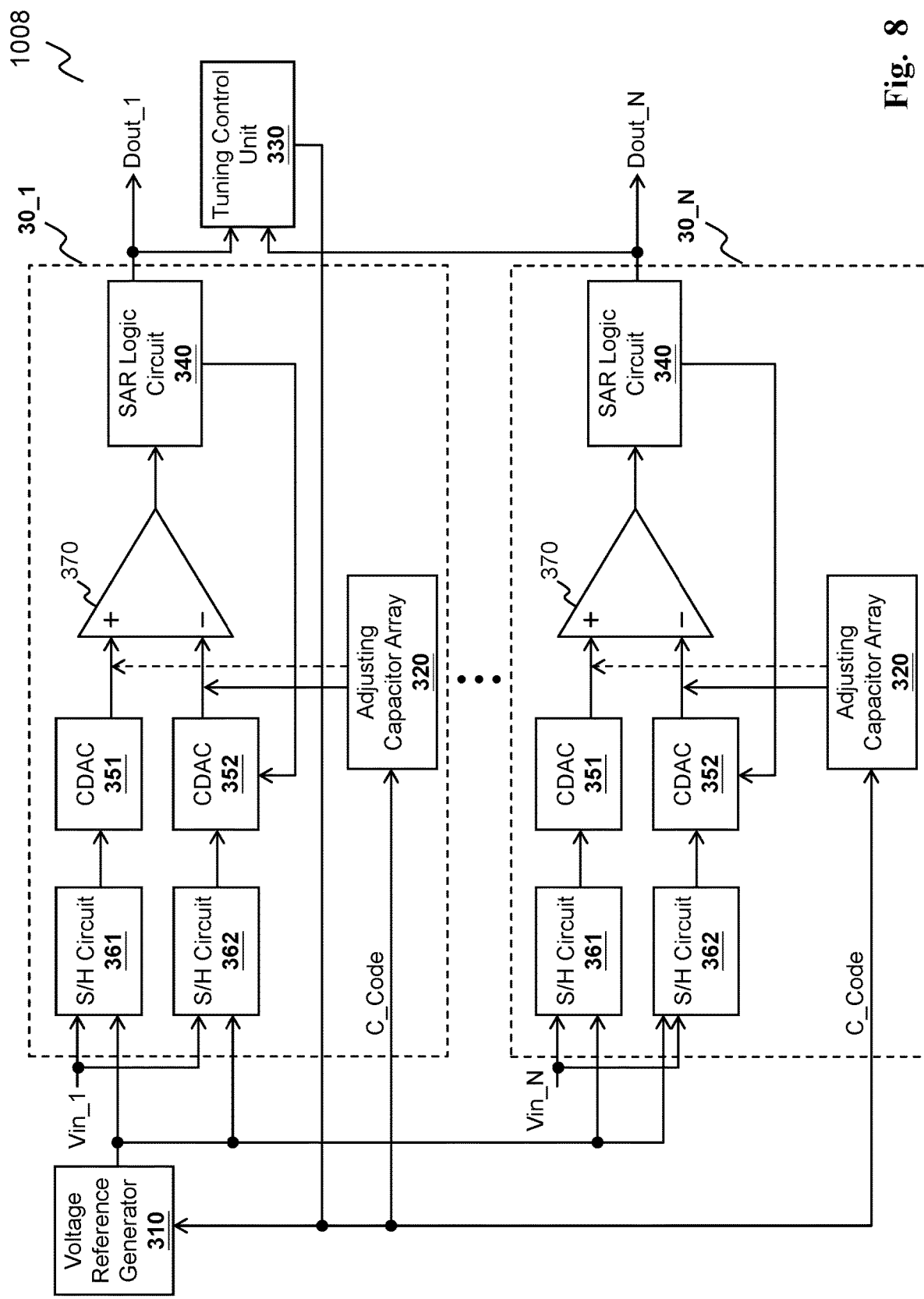
FIG. 8 shows a generalized block diagram of an embodiment of the auto-tuning of VFS implemented in multi-channel SAR ADC according to the present invention.

FIG. 8 shows a generalized block diagram of an embodiment of the auto-tuning of VFS, which can be extended to multi-channel SAR ADC (1008) according to the present invention. The SAR ADC 1008 includes sub-DAC 30_1 to sub_DAC 30_N, wherein N is a positive integer. In other words, SAR ADC 1008 can be single-channel or multi-channel ADC. The sub-DACs 30_1 to sub_DAC 30_N are configured to convert input signals Vin_1~Vin_N to ADC output digital code Dout_1~Dout_N respectively. The block diagram shows that the voltage reference generator 310 and the tuning control unit 330 can be shared in the multi-channel application. On the other hand, the adjusting capacitor array (320) is required and paired with CDAC of each of the sub_DACs.

Figure 1:
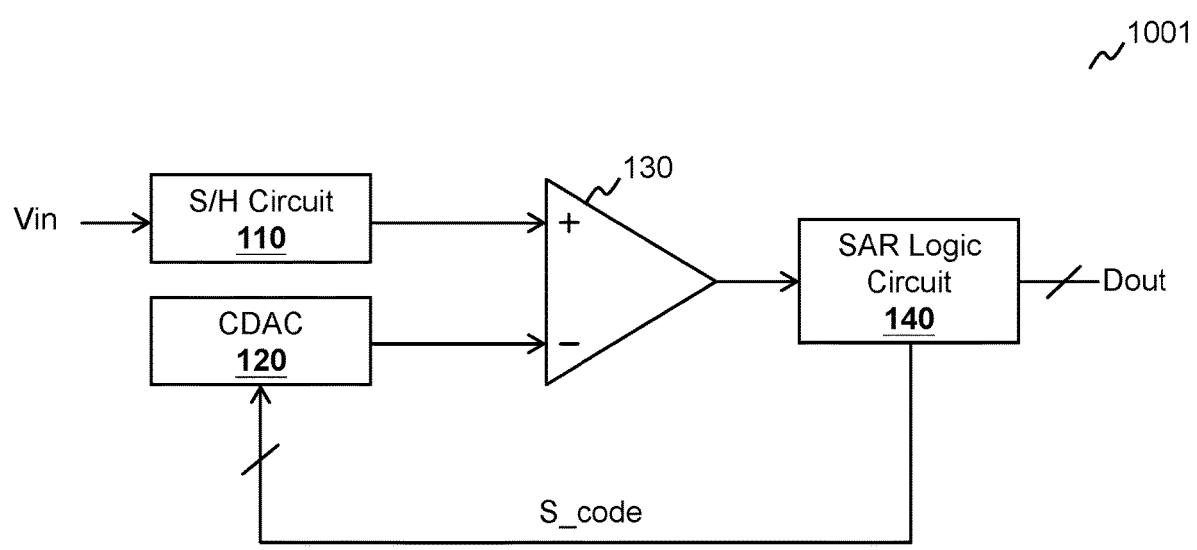
FIG. 1 shows a schematic diagram of a prior art SAR ADC.
Figure 2A:
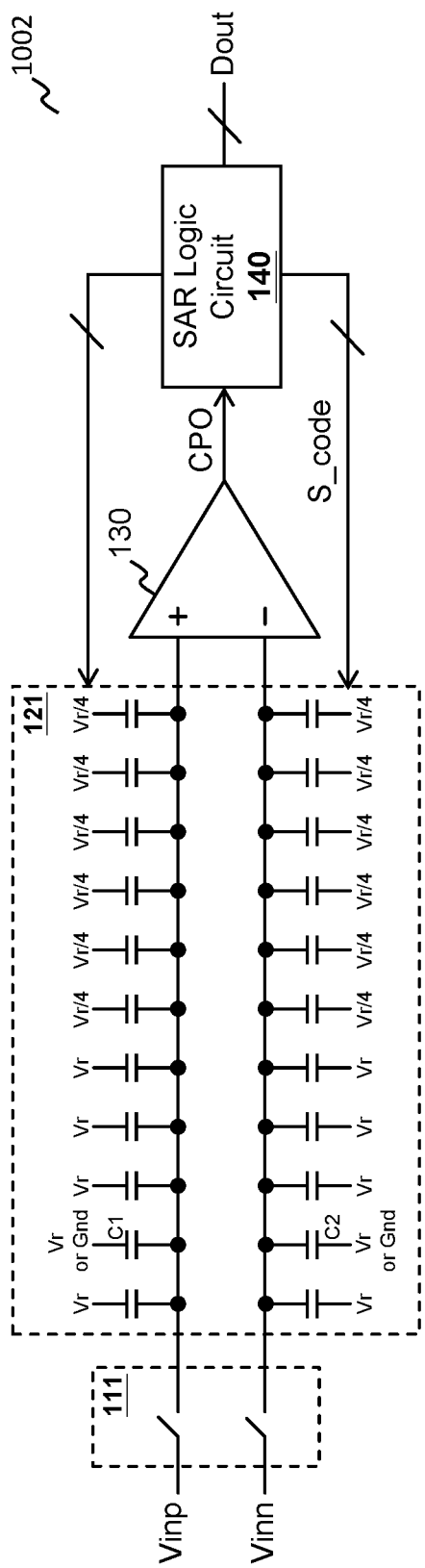
FIG. 2A shows a schematic diagram of another prior art SAR ADC.
Figure 2B:
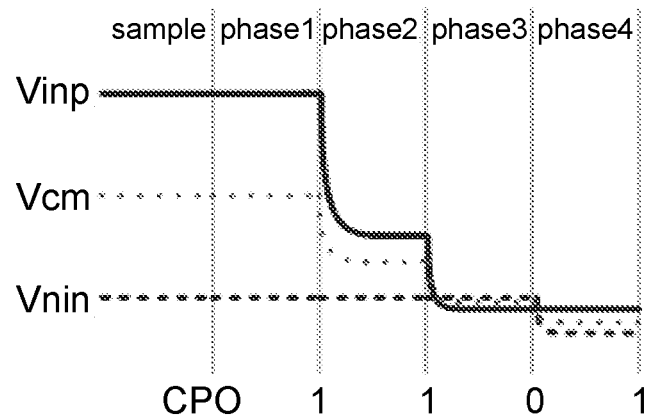
FIG. 2B and FIG. 2C show switching procedures of monotonic switching method and of switch-back switching method respectively.
Figure 2C:
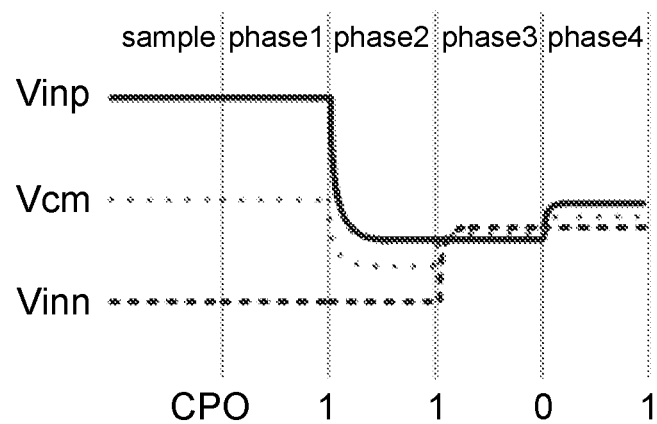

Note that the CDAC of FIG. 3, FIG. 4, and FIG. 8 according to the present invention can be a simple binary weighted capacitor array, or the array shown in FIG. 2A, which supports the monotonic or switch-back switching method as shown in FIG. 2B and FIG. 2C.

The present invention has been described in considerable detail with reference to certain preferred embodiments thereof. It should be understood that the description is for illustrative purpose, not for limiting the scope of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. Furthermore, those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. The spirit of the present invention should cover all such and other modifications and variations, which should be interpreted to fall within the scope of the following claims and their equivalents.

What is claimed is:

1. A successive approximation register analog-to-digital converter (SAR ADC), comprising:
    at least one sub-ADC, wherein each of the at least one sub-ADC is configured to convert a corresponding input signal to a corresponding SAR code; and
    a tuning control unit, configured to adjust a full-scale voltage of each of the sub-ADC to a corresponding predetermined target level in a VFS tuning mode;
    wherein each of the at least one sub-ADC includes:
        a sample-and-hold circuit, configured to operably generate a sample-and-hold signal by sample-and-holding the input signal;
        a capacitive digital-to-analog converter (CDAC), configured to operably generate a DAC output signal according to the SAR code;
        a comparator, configured to operably compare the sample-and-hold signal and the DAC output signal to generate a comparison signal;
        a SAR logic circuit, configured to operably generate the SAR code according to the comparison signal using a binary successive approximation register conversion method; and
        an adjusting capacitor array, coupled to an output terminal of the CDAC and configured to operably adjust an equivalent capacitance on the output terminal of the CDAC;
    wherein in the VFS tuning mode, the tuning control unit is configured to operably generate a capacitor tuning code to adjust the equivalent capacitance on the output terminal of the CDAC, so as to adjust a full-scale voltage of each of the at least one sub-ADC to the predetermined target level according to the following steps:
    S100: setting the capacitor tuning code to an initial code;
    S201: adjusting the input signal to plural reference voltages;
    S202: controlling the sub-ADC to convert the plural reference voltages to corresponding plural digital reference codes;
    S203: extrapolating plural pairs of the plural reference voltages versus the plural digital reference codes to obtain a calibrating full-scale voltage corresponding to the capacitor tuning code;
    S300: determining whether a difference between the calibrating full-scale voltage and the predetermined full-scale voltage level is meeting a target, wherein if the difference is meeting the target, entering a step S800, else entering a step S400;
    S400: updating the capacitor tuning code according to the difference and return to the step S201; and
    S800: memorizing the capacitor tuning code for the sub-ADC to operate with the full-scale voltage having the predetermined target level in a normal operation mode.

2. The SAR ADC of claim 1, wherein the step of updating the capacitor tuning code is achieved by a linear search method or by a binary successive approximation method.

3. The SAR ADC of claim 1,
    wherein a count of the plural reference voltages is equal to or higher than 3.

4. The SAR ADC of claim 1,
    wherein the step S203 further includes:

extrapolating the plural pairs of the plural reference voltages versus the plural digital reference codes to obtain an offset of the SAR DAC corresponding to the capacitor tuning code;

wherein the calibrating full-scale voltage is obtained by extrapolation after compensating the offset.

5. The SAR ADC of claim 1, wherein the adjusting capacitor array includes binary-weighted capacitors which are controlled by the capacitor tuning code.

6. The SAR ADC of claim 1, wherein the calibrating full-scale voltage decreases in response to the increasing of the equivalent capacitance on the output terminal of the CDAC.

7. The SAR ADC of claim 1, wherein the plural reference voltages are arranged in an arithmetic series.

8. The SAR ADC of claim 7, wherein one of the plural reference voltages is 0V.

9. The SAR ADC of claim 1, wherein all the plural reference voltages are smaller than the predetermined full-scale voltage level.

10. The SAR ADC of claim 1, wherein each of the sub-ADC is configured to operate in a monotonic switching method or in a switch-back switching method.

11. A method for automatically tuning a full-scale voltage of a successive approximation register analog-to-digital converter (SAR ADC), wherein the SAR ADC includes a sample-and-hold circuit for generating a sample-and-hold signal by sample-and-holding the input signal; a capacitive digital-to-analog converter (CDAC) for generating a DAC output signal according to the SAR code; a comparator for comparing the sample-and-hold signal and the DAC output signal to generate a comparison signal; and a SAR logic circuit for generating the SAR code according to the comparison signal using a binary successive approximation register conversion method; the method comprising:

providing a VFS adjusting means which is controlled by a tuning code for adjusting the full-scale voltage of the SAR ADC; and generating the tuning code to control the VFS adjusting means, so as to tune the full-scale voltage of the SAR ADC to a predetermined target level in a VFS tuning mode according to the following steps:

S100: setting the tuning code to an initial code;

S201: adjusting the input signal to plural reference voltages;

S202: controlling the sub-ADC to convert the plural reference voltages to plural digital reference codes;

S203: extrapolating plural pairs of the plural reference voltages versus the plural digital reference codes to obtain a calibrating full-scale voltage corresponding to the tuning code;

S300: determining whether a difference between the calibrating full-scale voltage and the predetermined full-scale voltage level is meeting a target, wherein if the difference is meeting the target, entering a step S800, else entering a step S400;

S400: updating the tuning code according to the difference and return to the step S201; and S800: memorizing the tuning code for the sub-ADC to operate with the full-scale voltage having the predetermined target level in a normal operation mode.

12. The method of claim 11, wherein the step of updating the tuning code is achieved by a linear search method or by a binary successive approximation method.

13. The method of claim 11, wherein a count of the plural reference voltages is equal to or higher than 3.

14. The method of claim 11, wherein the step S203 further includes:

extrapolating the plural pairs of the plural reference voltages versus the plural digital reference codes to obtain an offset of the SAR DAC corresponding to the tuning code;

wherein the calibrating full-scale voltage is obtained by extrapolation after compensating the offset.

15. The method of claim 11, wherein the VFS adjusting means includes binary-weighted capacitors which are controlled by the tuning code.

16. The method of claim 15, wherein the calibrating full-scale voltage decreases in response to the increasing of the equivalent capacitance on the output terminal of the CDAC.

17. The method of claim 11, wherein the plural reference voltages are arranged in an arithmetic series.

18. The method of claim 17, wherein one of the plural reference voltages is 0V.

19. The method of claim 11, wherein all the plural reference voltages are smaller than the predetermined full-scale voltage level.

20. The method of claim 11, wherein SAR ADC is configured to operably operate in a monotonic switching method or in a switch-back switching method.

* * * * *